United States Patent
Park

(10) Patent No.: US 10,968,534 B2
(45) Date of Patent: Apr. 6, 2021

(54) PULLING CONTROL DEVICE FOR SINGLE CRYSTAL INGOT GROWTH AND PULLING CONTROL METHOD APPLIED THERETO

(71) Applicant: SK SILTRON CO., LTD., Gumi-si (KR)

(72) Inventor: Hyun Woo Park, Gumi-si (KR)

(73) Assignee: SK Siltron Co., Ltd.

(*) Notice: Subject to any disclaimer, the term of this patent is extended or adjusted under 35 U.S.C. 154(b) by 163 days.

(21) Appl. No.: 16/244,028

(22) Filed: Jan. 9, 2019

(65) Prior Publication Data
US 2019/0218683 A1    Jul. 18, 2019

(30) Foreign Application Priority Data
Jan. 18, 2018   (KR) .................. 10-2018-0006539

(51) Int. Cl.
C30B 15/10   (2006.01)
C30B 15/22   (2006.01)
(Continued)

(52) U.S. Cl.
CPC .............. *C30B 15/22* (2013.01); *C30B 15/20* (2013.01); *C30B 15/30* (2013.01); *C30B 29/06* (2013.01)

(58) Field of Classification Search
CPC .......... C30B 15/00; C30B 15/02; C30B 15/10
See application file for complete search history.

(56) References Cited

U.S. PATENT DOCUMENTS 5,593,498 A    1/1997   Kimbel et al.
5,766,341 A    6/1998   Kimbel et al.
(Continued)

FOREIGN PATENT DOCUMENTS

CN   1171459 A   1/1998
CN   1415788 A   5/2003
(Continued)

OTHER PUBLICATIONS

KIPO Office Action dated Mar. 15, 2019 for corresponding Korean Application No. 10-2018-0006539, 5 pages.
(Continued)

*Primary Examiner* — Robert M Kunemund
(74) *Attorney, Agent, or Firm* — Lewis Roca Rothgerber Christie LLP

(57) ABSTRACT

The present invention relates to a pulling control device for growing a single crystal ingot capable of controlling an eccentricity of a single crystal ingot by varying a seed rotation number in real time, and a pulling control method applied thereto.

According to the present invention, a pulling control device for growing a single crystal ingot and a pulling control method applied thereto may minimize that a seed rotation number (f) is set to a specific rotation number (fo) causing a resonance phenomenon of a melt by providing a target seed output rotation number ($T\_f_{out}$) that varies in real time so as to match a rotation form for each length of an ingot according to inputting a target seed input rotation number ($T\_f_{in}$) and controlling a rotation number (f) of a seed cable, and it is possible to prevent fluctuation of the melt and an eccentricity phenomenon of the ingot.

10 Claims, 3 Drawing Sheets

(51) Int. Cl.
*C30B 29/06* (2006.01)
*C30B 15/30* (2006.01)
*C30B 15/20* (2006.01)

(56) References Cited

U.S. PATENT DOCUMENTS

| | | | | |
|---|---|---|---|---|
| 5,820,672 | A * | 10/1998 | Bell | C30B 15/22 |
| | | | | 117/20 |
| 5,863,326 | A * | 1/1999 | Nause | C30B 11/002 |
| | | | | 117/217 |
| 6,899,759 | B2 | 5/2005 | Kishida et al. | |
| 7,582,160 | B2 | 9/2009 | Kishida et al. | |
| 8,150,784 | B2 * | 4/2012 | Bandoh | C30B 29/06 |
| | | | | 706/21 |
| 2003/0089301 | A1 | 5/2003 | Kishida et al. | |
| 2006/0283378 | A1 | 12/2006 | Kishida et al. | |
| 2010/0100217 | A1 * | 4/2010 | Bandoh | C30B 15/20 |
| | | | | 700/104 |
| 2010/0326349 | A1 * | 12/2010 | Fukui | C30B 29/06 |
| | | | | 117/15 |

FOREIGN PATENT DOCUMENTS

| | | |
|---|---|---|
| CN | 1932085 A | 3/2007 |
| CN | 104775158 A | 7/2015 |
| CN | 106283178 A | 1/2017 |
| JP | 06279171 A | 10/1994 |
| JP | 1095698 A | 4/1998 |
| JP | H11322488 A | 11/1999 |
| JP | 11335198 A | 12/1999 |
| JP | 2005015298 A | 1/2005 |
| JP | 2005145724 A | 6/2005 |
| JP | 2011037667 A | 2/2011 |
| JP | 2015117168 A | 6/2015 |
| KR | 1020010080084 A | 8/2001 |
| KR | 2003-0035940 A | 5/2003 |
| KR | 1020160016185 A | 2/2016 |

OTHER PUBLICATIONS

Japanese Office action dated Jan. 7, 2020 for corresponding JP Application No. 2019-005295, 3 pages.

Korean Notice of Allowance issued by the KIPO dated Jul. 30, 2019, for corresponding KR Application No. 10-2018-0006539 (2 pages).

Chinese Patent Office Action dated Sep. 9, 2020 in corresponding CN Application No. 201910047191.X, 5 pages.

* cited by examiner

PULLING CONTROL DEVICE FOR SINGLE CRYSTAL INGOT GROWTH AND PULLING CONTROL METHOD APPLIED THERETO

CROSS-REFERENCE TO RELATED APPLICATION

This application claims priority to and the benefit of Korean Patent Application No. 10-2018-0006539, filed on Jan. 18, 2018, the disclosure of which is incorporated herein by reference in its entirety.

TECHNICAL FIELD

The present invention relates to a pulling control device for growing a single crystal ingot capable of controlling an eccentricity of a single crystal ingot by varying a seed rotation number in real time, and a pulling control method applied thereto.

BACKGROUND

In general, a single crystal ingot which is used as a material for producing an electronic component such as a semiconductor is fabricated by a Czochralski (hereinafter referred to as CZ) method.

In a method of fabricating a single crystal ingot by using the CZ method, a solid raw material such as polycrystalline silicon (polysilicon) is filled in a quartz crucible and heated to be melted by a heater to form a silicon melt, and air bubbles in the silicon melt are removed via a stabilization process, and then a seed is dipped into the silicon melt, and the seed is slowly pulled up above the melt while forming a necking, so that a necking process, a shouldering process, a body growing process, and a tailing process are sequentially performed.

However, while growing a single crystal ingot from a silicon melt in the crucible, it has been found that the cause of fluctuation of the silicon melt is due to resonance.

In addition, a resonance phenomenon of a melt becomes larger as a single crystal melt decreases, and a liquid surface wave tends to occur markedly when it is close to an integral multiple of rotation number of a seed. However, as a single crystal ingot growth progresses, an amount of the melt further decreases and the wave of the melt sinks gradually.

Korean Laid-open Patent Publication No. 2003-0035940 discloses a method for manufacturing a single crystal that controls one of a crucible rotation number and a seed rotation number such that a frequency of driving a melt determined by a rotation number of a crucible and a rotation number of a crystal is not within a range of 95% to 105% of a resonance frequency of the melt.

Therefore, it is possible to prevent fluctuation of the liquid surface in the crucible during the crystal growth, and to prevent crystal dislocation and poly crystallization.

In general, while a single crystal ingot growth process is proceeded once, a seed rotation number is set constant or decreases to a constant gradient, and the seed rotation number affects not only oxygen concentration in a radial direction (radial Oi) but also oxygen concentration in an axial direction (axial Oi) in the single crystal ingot, and also changes a range of a defect-free region in a crystal region.

Of course, the axial Oi of the single crystal ingot may also be controlled by the rotation number of the crucible, but the radial Oi of the single crystal ingot and the defect-free region range of the crystal region may be controlled by only a seed rotation number.

However, in specific process development conditions, a resonance phenomenon of a silicon melt occurs more frequently by setting a seed rotation number (f) to a specific rotation number (fo), fluctuation of a liquid surface occurs due to the resonance phenomenon of the silicon melt, and an eccentricity (orbit) phenomenon occurs in which a crystal grows in an eccentric state due to rotation of a seed cable at the eccentric position of the crucible, and the single crystal ingot is biased to one side by the eccentricity phenomenon and made into a zigzag form.

Accordingly, the surface of the single crystal ingot is subjected to a process of grinding the surface, and since it is necessary to grind a portion in which eccentricity occurs in the single crystal ingot, it is difficult to process the diameter of the single crystal ingot uniformly. When the eccentricity is intense, since the grinding process should be proceeded after cutting the single crystal ingot in the axial direction, there is a problem that a lot of working time is required.

In addition, there is a problem that it is difficult to guarantee quality in the oxygen concentration in the radial direction of the single crystal ingot and the defect-free region of the crystal region.

SUMMARY

The present invention is directed to solving the above-described problems in the related art and providing a pulling control device for growing a single crystal ingot capable of controlling an eccentricity of a single crystal ingot by varying a seed rotation number in real time, and a pulling control method applied thereto.

According to the present invention, there is provided a pulling control device for growing a single crystal ingot including: a pulling drive unit configured to rotate and pull up a seed cable connected to a seed dipped in a silicon melt; and a pulling control unit configured to output a target seed output rotation number ($T\_f_{out}$) that varies in real time so as to match a rotation form for each length of an ingot according to inputting a preset target seed input rotation number ($T\_f_{in}$), and control a rotation number (f) of the pulling drive unit according to the target seed output rotation number ($T\_f_{out}$).

The pulling control unit may include a determination part configured to determine whether or not the rotation form for each length of the ingot is constant according to the inputting of the preset target seed input rotation number ($T\_f_{in}$), a calculation part configured to calculate the target seed output rotation number ($T\_f_{out}$) in a functional form according to a determination result of the determination part, and an output part configured to output the target seed output rotation number ($T\_f_{out}$) to the pulling drive unit according to a calculation result of the calculation part.

The calculation part may calculate the target seed output rotation number ($T\_f_{out}$) into a sin function when the rotation form is constant for each length of the ingot in the determination result of the determination part, and may calculate the target seed output rotation number ($T\_f_{out}$) such that an average value of the sin function coincides with the target seed input rotation number ($T\_f_{in}$).

On the other hand, the calculation part may calculate the target seed output rotation number ($T\_f_{out}$) into a linear function when the rotation form changes for each length of the ingot in the determination result of the determination part, and may calculate the target seed output rotation number ($T\_f_{out}$) such that the linear function has a gradient that constantly decreases from a maximum value (max) to a minimum value (min) of the target seed input rotation number ($T\_f_{in}$).

Meanwhile, according to an embodiment of the present invention, there is provided a pulling control method for growing a single crystal ingot including: a pulling drive operation of rotating and pulling up a seed cable connected to a seed dipped in a silicon melt; and a pulling control operation of outputting a target seed output rotation number ($T\_f_{out}$) that varies in real time so as to match a rotation form for each length of an ingot according to inputting a preset target seed input rotation number ($T\_f_{in}$), and controlling a rotation number (f) of the seed cable according to the target seed output rotation number ($T\_f_{out}$).

The pulling control operation may include a determining process of determining whether or not the rotation form for each length of the ingot is constant according to the inputting of the preset target seed input rotation number ($T\_f_{in}$), a calculation process of calculating the target seed output rotation number ($T\_f_{out}$) in a functional form according to a determination result of the determining process, and an outputting process of outputting the target seed output rotation number ($T\_f_{out}$) according to a calculation result of the calculation process and controlling the rotation number (f) of the seed cable.

The calculation process may calculate the target seed output rotation number ($T\_f_{out}$) into a sin function when the rotation form for each length of the ingot is constant in the determination result of the determining process, and may calculate the target seed output rotation number ($T\_f_{out}$) such that an average value of the sin function coincides with the target seed input rotation number ($T\_f_{in}$).

On the other hand, the calculation process may calculate the target seed output rotation number ($T\_f_{out}$) into a linear function when the rotation form changes for each length of the ingot in the determination result of the determining process, and may calculate the target seed output rotation number ($T\_f_{out}$) such that the linear function has a gradient that constantly decreases from a maximum value (max) to a minimum value (min) of the target seed input rotation number ($T\_f_{in}$).

DETAILED DESCRIPTION OF THE EMBODIMENTS

Hereinafter, embodiments will be described in detail with reference to the accompanying drawings. However, the scope of the spirit of the present invention may be determined from the matters disclosed in the embodiments, and the spirit of the present invention of the embodiments includes practical modifications such as addition, deletion, modification, and the like of components to the following proposed embodiments.

Figure 1:
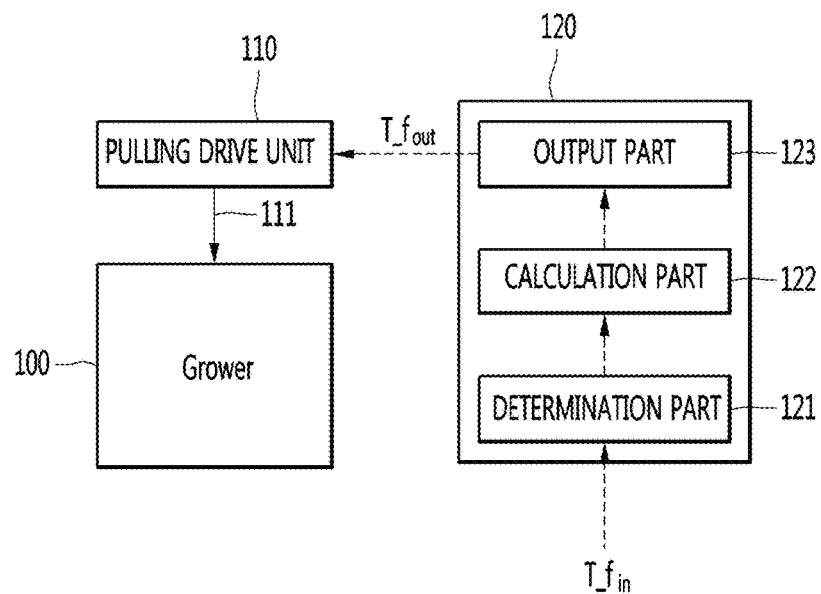
FIG. 1 is a configuration diagram illustrating a pulling control device for growing a single crystal ingot according to the present invention.
Figure 2:
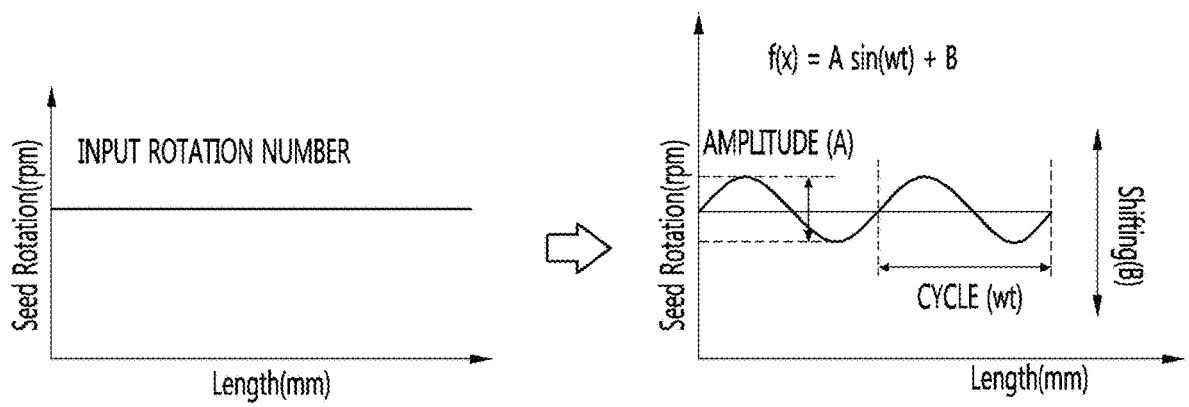
FIGS. 2 and 3 are graphs illustrating a rotation number input/output to/from a pulling control unit applied to FIG. 1.
Figure 3:
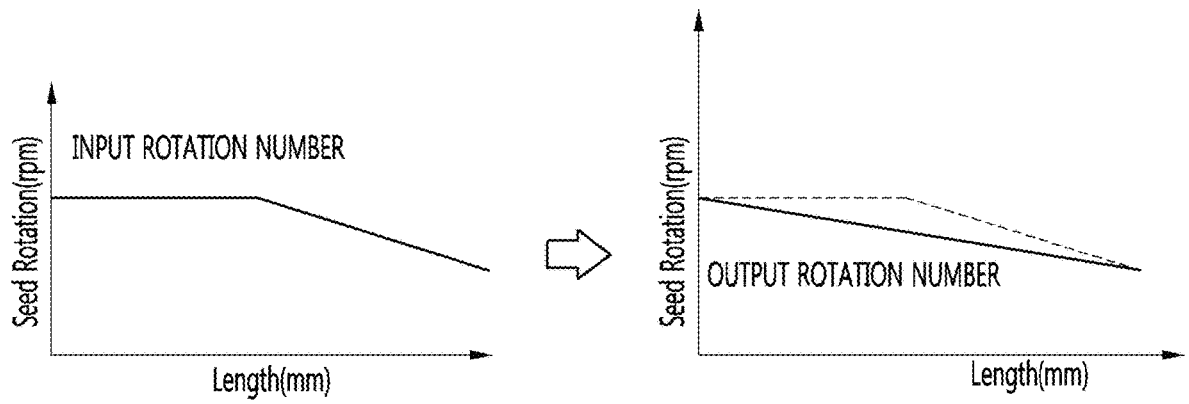

FIG. 1 is a configuration diagram illustrating a pulling control device for growing a single crystal ingot according to the present invention, and FIGS. 2 and 3 are graphs illustrating a rotation number input/output to/from a pulling control unit applied to FIG. 1.

The pulling control device for growing a single crystal ingot according to the present invention, as shown in FIG. 1, includes a pulling drive unit 110 configured to rotate and pull up a seed cable 111 connected to a seed chuck to which a seed crystal is hung, and a pulling control unit 120 configured to control so as to vary in real time a rotation number (f) of the pulling drive unit 110, wherein the pulling control unit 120 controls the rotation number (f) of the pulling drive unit 110 by outputting a target seed output rotation number ($T\_f_{out}$) configured to match a rotation form for each length of an ingot according to inputting a preset target seed input rotation number ($T\_f_{in}$).

In general, a single crystal ingot growth device 100 is configured so as to dip a seed crystal hung to the seed cable 111 in a silicon melt accommodated in a crucible (not shown), and rotate and pull up the seed cable 111 to grow a single crystal ingot.

The pulling drive unit 110 is a device configured to drive a drum (not shown) around which the seed cable 111 is wound, and may control a rotation number (f) and a pulling speed (P/S) of the seed cable 111.

Of course, since the pulling drive unit 110 is a disclosed technology and may be variously configured, detailed description will be omitted.

The pulling control unit 120 may include a determination part 121 configured to determine the rotation form for each length of the ingot according to the preset target seed input rotation number ($T\_f_{in}$), a calculation part 122 configured to calculate so as to vary in real time the target seed output rotation number ($T\_f_{out}$) into a separate functional form according to a determination result of the determination part 121, and an output part 123 configured to output the target seed output rotation number ($T\_f_{out}$) to the pulling drive unit 110 according to a calculation result of the calculation part 122.

The determination part 121 receives the preset target seed input rotation number ($T\_f_{in}$), and in view of the characteristics of a single crystal ingot growth process, receives the target seed input rotation number ($T\_f_{in}$) with a constant value or receives in a form that maintains a constant value and decreases to a constant gradient.

According to an embodiment, when the target seed input rotation number ($T\_f_{in}$) is maintained at a constant value as shown in FIG. 2, the determination part 121 determines that the rotation form for each length of the ingot is constant, but when the target seed input rotation number ($T\_f_{in}$) maintains a constant value and then decreases to a constant gradient as shown in FIG. 3, the determination part 121 determines that the rotation form for each length of the ingot has changed.

The calculation part 122 calculates the target seed output rotation number ($T\_f_{out}$) so as to be varied in real time in a form of a sin function or a linear function according to the rotation form for each length of the ingot in the determination result of the determination part 121.

According to an embodiment, when the rotation form for each length of the ingot is constant in the determination result of the determination part 121, the calculation part 122 calculates the target seed output rotation number ($T\_f_{out}$) into a sin function of which an average value coincides with the target seed input rotation number ($T\_f_{in}$) as shown in FIG. 2, but when the rotation form changes for each length of the ingot in the determination result of the determination part 121, the calculation part 122 calculates the target seed output rotation number ($T\_f_{out}$) into a linear function that decreases with a constant gradient from a maximum value (max) to a minimum value (min) of the target seed input rotation number ($T\_f_{in}$) as shown in FIG. 3.

As described above, the target seed output rotation number ($T\_f_{out}$) varied in real time is provided to the pulling drive unit 110 by the output part 123, and it is possible to prevent the seed rotation number (f) from being set to a specific rotation number (fo) causing the resonance phenomenon of a melt by varying the rotation number (f) of the seed cable 111 in real time.

Figure 4:
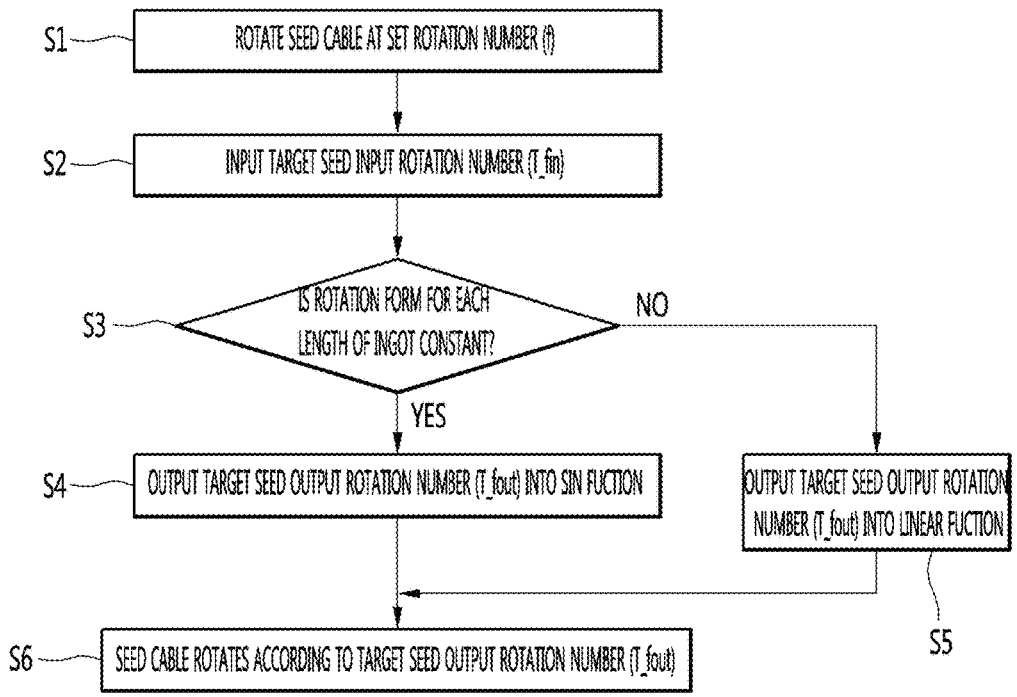
FIG. 4 is a flowchart illustrating a pulling control method for growing a single crystal ingot according to the present invention.

FIG. 4 is a flowchart illustrating a pulling control method for growing a single crystal ingot according to the present invention.

First, a single crystal ingot is grown by rotating a seed cable at a set rotation number. (see S1)

According to an embodiment, a seed crystal hung to the seed cable is dipped in a silicon melt accommodated in a crucible, and a single crystal ingot grows from the silicon melt by pulling up while gradually rotating the seed cable.

Of course, a seed rotation number (f) is determined by a rotation number (f) of the seed cable, and as the seed rotation number is slower, a diameter of the single crystal ingot may be formed larger.

Next, when a target seed input rotation number ($T\_f_{in}$) is input, the rotation form for each length of the ingot is determined. (see S2, S3)

According to an embodiment, when a body growing process proceeds, since the seed rotation number (f) should be maintained at a constant value, the target seed input rotation number ($T\_f_{in}$) is also input at a constant value.

On the other hand, when a shouldering process is proceeded from a necking process, since the seed rotation number (f) should be maintained at a constant value and then decreased to a constant gradient, the target seed input rotation number ($T\_f_{in}$) is also input in a form that is maintained at a constant value and then decreases to a constant gradient.

Accordingly, when the target seed input rotation number ($T\_f_{in}$) is input with a constant value, it is determined that the rotation form for each length of the ingot is constant, but when the target seed input rotation number ($T\_f_{in}$) is also input in a form that is maintained at a constant value and then decreases to a constant gradient, it is determined that the rotation form for each length of the ingot has changed.

Next, when the rotation form for each length of the ingot is constant, a target seed output rotation number ($T\_f_{out}$) is calculated into a sin function, whereas, when the rotation form for each length of the ingot changes, the target seed output rotation number ($T\_f_{out}$) is calculated into a linear function. (see S4, S5)

According to an embodiment, a target seed output rotation number ($T\_f_{out}=f(x)$) expressed by a sin function is set to a predetermined amplitude (A), a cycle (wt), and a variation value (B) on the basis of a target seed input rotation number ($T\_f_{in}$), and is determined by the following Equation 1.

$$f(x) = A \sin(wt) + B \quad \text{[Equation 1]}$$

For example, when the target seed input rotation number ($T\_f_{in}$) is input at 10 rpm, the target seed output rotation number ($T\_f_{out}$) may be calculated in the form of a sin function in which the amplitude (A) is set to 10 rpm±0.5 rpm and the cycle (wt) is set to 100 to 500 mm.

Of course, as a cycle is shorter, eccentricity control effect of a single crystal ingot is higher, but since it may affect a pulling speed and induce a dislocation phenomenon, it is preferable that a range is set within an appropriate range.

According to an embodiment, a target seed output rotation number ($T\_f_{out}$) expressed in a linear function is calculated by obtaining the maximum value (max) and the minimum value (min) of a target seed input rotation number ($T\_f_{in}$), and then is applied by calculating a reduction amount for each length of a single crystal ingot.

The rotation number (f) of the seed cable is controlled according to the target seed output rotation number ($T\_f_{out}$) calculated as described above. (see S6)

Accordingly, since the target seed output rotation number ($T\_f_{out}$) is varied in real time for each length of the ingot, it is possible to prevent the seed rotation number (f) from being set to a specific rotation number (fo) causing the resonance phenomenon of the silicon melt and to prevent the fluctuation of the melt and the eccentricity phenomenon of the ingot.

In addition, since the average value of the target seed output rotation number ($T\_f_{out}$) coincides with the target seed input rotation number ($T\_f_{in}$) or is controlled within a predetermined error range, quality may be guaranteed in a radial oxygen concentration (radial Oi), an axial oxygen concentration (axial Oi), and a defect-free region of a crystal region of the single crystal ingot, which are affected by the seed rotation number (f).

Figure 5:
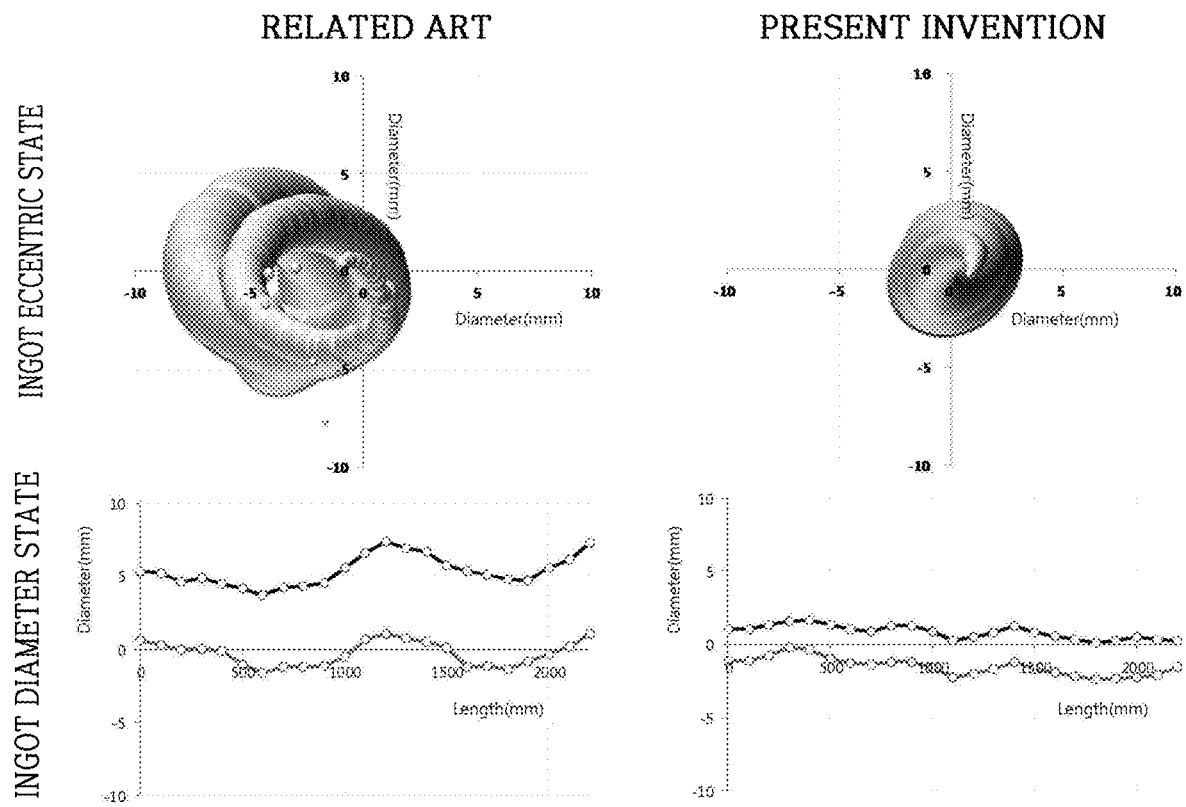
FIG. 5 is a graph illustrating an eccentric state and a diameter state of a single crystal ingot manufactured according to the related art and the present invention, respectively.

FIG. 5 is a graph illustrating an eccentric state and a diameter state of a single crystal ingot manufactured according to the related art and the present invention, respectively.

In the related art, a single crystal ingot is manufactured by controlling a seed rotation number with a preset target seed input rotation number, whereas in the present invention, a single crystal ingot is manufactured by controlling a seed rotation number with a target seed output rotation number calculated into a sin function or a linear function according to a target seed input rotation number.

In an eccentric state of a single crystal ingot, the single crystal ingot of the related art appears in an eccentric state biased to a left side, whereas the single crystal ingot of the present invention appears to almost coincide with a center thereof.

In a deviation of a target diameter at a left/right side diameter position of a single crystal ingot, a diameter deviation of the single crystal ingot of the related art appears relatively large in the eccentric state, but it may be seen that a diameter deviation of the single crystal ingot of the present invention is remarkably reduced at the center and improved.

According to the present invention, a pulling control device for growing a single crystal ingot and a pulling control method applied thereto can minimize that a seed rotation number (f) is set to a specific rotation number (fo) causing a resonance phenomenon of a melt by providing a target seed output rotation number ($T\_f_{out}$) that varies in real time so as to match a rotation form for each length of an ingot according to inputting a target seed input rotation number ($T\_f_{in}$) and controlling a rotation number (f) of a seed cable, and it is possible to prevent fluctuation of the melt and an eccentricity phenomenon of the ingot.

Therefore, a single crystal ingot can be grown straight in an axial direction, so that a diameter of the single crystal ingot can be formed uniformly even with a simple grinding process, and a working time can be reduced.

In addition, since the seed rotation number (f) is varied to the target seed output rotation number ($T\_f_{out}$) expressed in a sin function or a linear function according to the level of the target seed input rotation number ($T\_f_{in}$), there is an advantage that quality may be guaranteed in a radial oxygen concentration (Radial Oi) and an axial oxygen concentration (axial Oi) of the single crystal ingot and a defect-free region in a crystal region.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

DESCRIPTION OF REFERENCE NUMERALS

| | |
|---|---|
| 100: single crystal ingot growth device | 110: pulling drive unit |
| 111: seed cable | 120: pulling control unit |
| 121: determination part | 122: calculation part |
| 123: output part | |

What is claimed is:

1. A pulling control device for growing a single crystal ingot, the device comprising:
    a pulling drive unit configured to rotate and pull up a seed cable connected to a seed dipped in a silicon melt; and
    a pulling control unit configured to output a target seed output rotation number ($T\_f_{out}$) that varies in real time so as to match a rotation form for each length of an ingot according to inputting a preset target seed input rotation number ($T\_f_{in}$), and control a rotation number (f) of the pulling drive unit according to the target seed output rotation number ($T\_f_{out}$),
    wherein the pulling control unit comprises:
    a determination part configured to determine whether or not the rotation form for each length of the ingot is constant according to the inputting of the preset target seed input rotation number ($T\_f_{in}$),
    a calculation part configured to calculate the target seed output rotation number ($T\_f_{out}$) in a functional form according to a determination result of the determination part, and
    an output part configured to output the target seed output rotation number ($T\_f_{out}$) to the pulling drive unit according to a calculation result of the calculation part.

2. The device of claim 1, wherein the calculation part calculates the target seed output rotation number ($T\_f_{out}$) into a sin function when the rotation form is constant for each length of the ingot in the determination result of the determination part.

3. The device of claim 2, wherein the calculation part calculates the target seed output rotation number ($T\_f_{out}$) such that an average value of the sin function coincides with the target seed input rotation number ($T\_f_{in}$).

4. The device of claim 1, wherein the calculation part calculates the target seed output rotation number ($T\_f_{out}$) into a linear function when the rotation form changes for each length of the ingot in the determination result of the determination part.

5. The device of claim 4, wherein the calculation part calculates the target seed output rotation number ($T\_f_{out}$) such that the linear function has a gradient that constantly decreases from a maximum value (max) to a minimum value (min) of the target seed input rotation number ($T\_f_{in}$).

6. A pulling control method for growing a single crystal ingot, the method comprising:
    a pulling drive operation of rotating and pulling up a seed cable connected to a seed dipped in a silicon melt; and
    a pulling control operation of outputting a target seed output rotation number ($T\_f_{out}$) that varies in real time so as to match a rotation form for each length of an ingot according to inputting a preset target seed input rotation number ($T\_f_{in}$), and controlling a rotation number (f) of the seed cable according to the target seed output rotation number ($T\_f_{out}$),
    wherein the pulling control operation comprises:
    a determining process of determining whether or not the rotation form for each length of the ingot is constant according to the inputting of the preset target seed input rotation number ($T\_f_{in}$),
    a calculation process of calculating the target seed output rotation number ($T\_f_{out}$) in a functional form according to a determination result of the determining process, and
    an outputting process of outputting the target seed output rotation number ($T\_f_{out}$) according to a calculation result of the calculation process and controlling the rotation number (f) of the seed cable.

7. The method of claim 6, wherein the calculation process calculates the target seed output rotation number ($T\_f_{out}$) into a sin function when the rotation form for each length of the ingot is constant in the determination result of the determining process.

8. The method of claim 7, wherein the calculation process calculates the target seed output rotation number ($T\_f_{out}$) such that an average value of the sin function coincides with the target seed input rotation number ($T\_f_{in}$).

9. The method of claim 6, wherein the calculation process calculates the target seed output rotation number ($T\_f_{out}$) into a linear function when the rotation form changes for each length of the ingot in the determination result of the determining process.

10. The method of claim 9, wherein the calculation process calculates the target seed output rotation number (T_f.sub.out) such that the linear function has a gradient that constantly decreases from a maximum value (max) to a minimum value (min) of the target seed input rotation number ($T\_f_{in}$).

* * * * *